US012685075B2

(12) United States Patent
Tseng

(10) Patent No.: US 12,685,075 B2
(45) Date of Patent: Jul. 14, 2026

(54) METHOD FOR MAPPING WAFERS IN A WAFER CARRIER

(71) Applicant: Taiwan Semiconductor Manufacturing Company, Ltd., Hsinchu (TW)

(72) Inventor: Lee-Chuan Tseng, New Taipei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 147 days.

(21) Appl. No.: 18/640,118

(22) Filed: Apr. 19, 2024

(65) Prior Publication Data

US 2024/0266196 A1     Aug. 8, 2024

Related U.S. Application Data

(63) Continuation of application No. 17/190,704, filed on Mar. 3, 2021, now Pat. No. 11,996,308.

(51) Int. Cl.
G01V 8/12          (2006.01)
B65G 47/90        (2006.01)
H10P 72/00        (2026.01)

(52) U.S. Cl.
CPC ........ H10P 72/0608 (2026.01); B65G 47/905 (2013.01); G01V 8/12 (2013.01)

(58) Field of Classification Search
CPC ......... H01L 21/67242; H01L 21/67259; H01L 21/67265; G65G 47/905; G01V 8/12
See application file for complete search history.

(56) References Cited

U.S. PATENT DOCUMENTS

| | | | | |
|---|---|---|---|---|
| 5,504,345 | A | * 4/1996 | Bartunek | .......... H01L 21/67259 |
| | | | | 414/936 |
| 7,663,129 | B1 | 2/2010 | Lu | |
| 2003/0119214 | A1 | 6/2003 | Kitazawa et al. | |
| 2005/0035313 | A1 | 2/2005 | Garssen et al. | |
| 2008/0283757 | A1 | 11/2008 | Vahey et al. | |

(Continued)

FOREIGN PATENT DOCUMENTS

| | | |
|---|---|---|
| CN | 111199897 A | 5/2020 |
| WO | 2019096595 A1 | 5/2019 |

OTHER PUBLICATIONS

Renz, Benjamin. "Application spotlight: Wafer mapping" Balluff GmbH. The date of publication is unknown. Retrieved online on Mar. 1, 2021 from https://www.innovating-automation.blog/application-spotlight-wafer-mapping/.

(Continued)

*Primary Examiner* — Kevin K Pyo
(74) *Attorney, Agent, or Firm* — Eschweiler & Potashnik, LLC

(57)          ABSTRACT

A method includes generating a first beam of radiation toward a first slot of a workpiece carrier. The first beam of radiation has a first beam area that is greater than or equal to an area of an opening of the first slot. The method further includes measuring a reflected portion of the first beam of radiation that is reflected toward, and impinges on, a radiation sensor. The method further includes determining if the first slot of the workpiece carrier is holding a workpiece based on the measured reflected portion of the first beam of radiation.

20 Claims, 12 Drawing Sheets

1000 ⌄

(56) References Cited

U.S. PATENT DOCUMENTS

| | | |
|---|---|---|
| 2012/0281193 A1 | 11/2012 | Loopstra et al. |
| 2012/0281875 A1 | 11/2012 | Yasuda et al. |
| 2014/0357089 A1 | 12/2014 | Buckalew et al. |
| 2015/0050815 A1 | 2/2015 | Yanagisawa et al. |
| 2016/0041478 A1 | 2/2016 | Mulkens et al. |
| 2016/0111311 A1 | 4/2016 | Lee et al. |
| 2018/0090357 A1 | 3/2018 | Katsuda et al. |
| 2019/0067055 A1 | 2/2019 | Zheng et al. |
| 2019/0252229 A1 | 8/2019 | Ishii et al. |
| 2020/0020558 A1 | 1/2020 | Liao et al. |
| 2020/0286752 A1 | 9/2020 | Toyomaki et al. |
| 2020/0365436 A1 | 11/2020 | Houng et al. |
| 2020/0411348 A1 | 12/2020 | Yoshida et al. |
| 2021/0003391 A1 | 1/2021 | Tsuji |
| 2021/0057246 A1 | 2/2021 | Bergantz et al. |
| 2021/0280442 A1 | 9/2021 | Kim |
| 2022/0111529 A1 | 4/2022 | Pehlivan et al. |
| 2022/0259739 A1 | 8/2022 | Fujibayashi et al. |
| 2022/0285186 A1 | 9/2022 | Tseng |
| 2022/0310436 A1 | 9/2022 | Kitagishi et al. |
| 2022/0351994 A1 | 11/2022 | Yoshida et al. |
| 2022/0351996 A1 | 11/2022 | Li |
| 2022/0359261 A1 | 11/2022 | Yoshida et al. |
| 2023/0058606 A1 | 2/2023 | Bergantz et al. |
| 2023/0089089 A1 | 3/2023 | Wong et al. |
| 2023/0147310 A1 | 5/2023 | Saito et al. |

OTHER PUBLICATIONS

Banner Engineering Corp. "Wafer Mapping with Bargraph Display" The date of publication is unknown. Retrieved online on Mar. 1, 2021 from https://www.bannerengineering.com/in/en/solutions/other/wafer-mapping-with-bargraph-display.html#.

Optex FA Co., Ltd. "Photoelectric Sensors" The date of publication is unknown. Retrieved online on Mar. 1, 2021 from https://www.optex-fa.com/tech_guide/photo_sensor/solution/industry/semicon/.

Banner Engineering Corp. "Wafer Mapping in a Cassette" The date of publication is unknown. Retrieved online on Mar. 1, 2021 from https://www.bannerengineering.com/th/en/solutions/other/wafer-mapping-in-a-cassette.html.

Non-Final Office Action dated Jun. 9, 2023 for U.S. Appl. No. 17/190,704.

Final Office Action dated Nov. 9, 2023 for U.S. Appl. No. 17/190,704.

Notice of Allowance dated Jan. 26, 2024 for U.S. Appl. No. 17/190,704.

* cited by examiner

600 —

| Generate a beam of radiation toward a slot of a wafer carrier, the beam of radiation having a substantially large beam area | — 602 |
|---|---|

↓

| Measure a reflected portion of the beam of radiation | — 604 |
|---|---|

↓

| Determine if the slot of the wafer carrier is holding a wafer based on the measured reflected portion of the beam | — 606 |
|---|---|

700 —

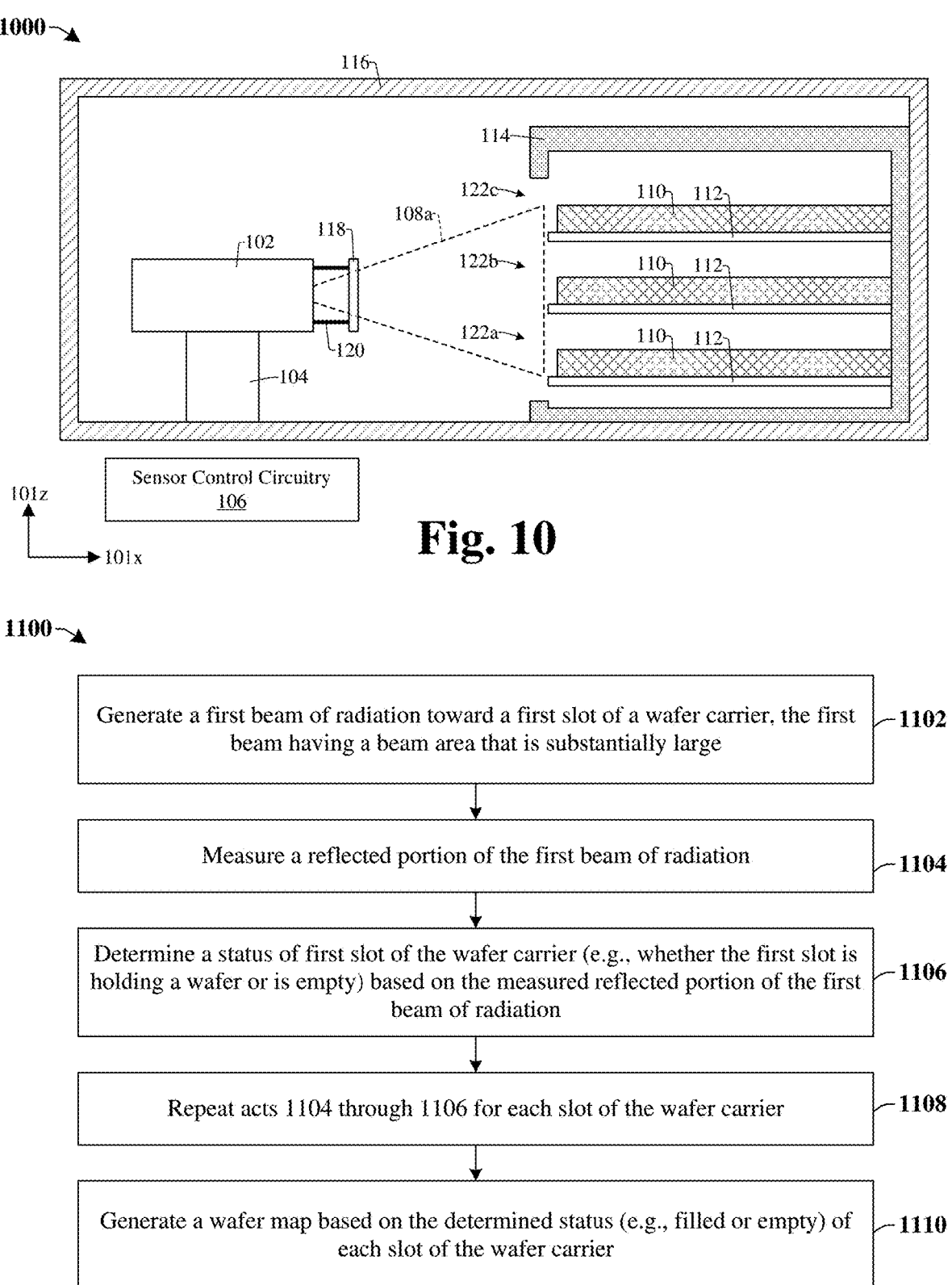

| Generate a first beam of radiation toward a first slot of a wafer carrier, the first beam having a beam area that is substantially large | 1102 |

| Measure a reflected portion of the first beam of radiation | 1104 |

| Determine a status of first slot of the wafer carrier (e.g., whether the first slot is holding a wafer or is empty) based on the measured reflected portion of the first beam of radiation | 1106 |

| Repeat acts 1104 through 1106 for each slot of the wafer carrier | 1108 |

| Generate a wafer map based on the determined status (e.g., filled or empty) of each slot of the wafer carrier | 1110 |

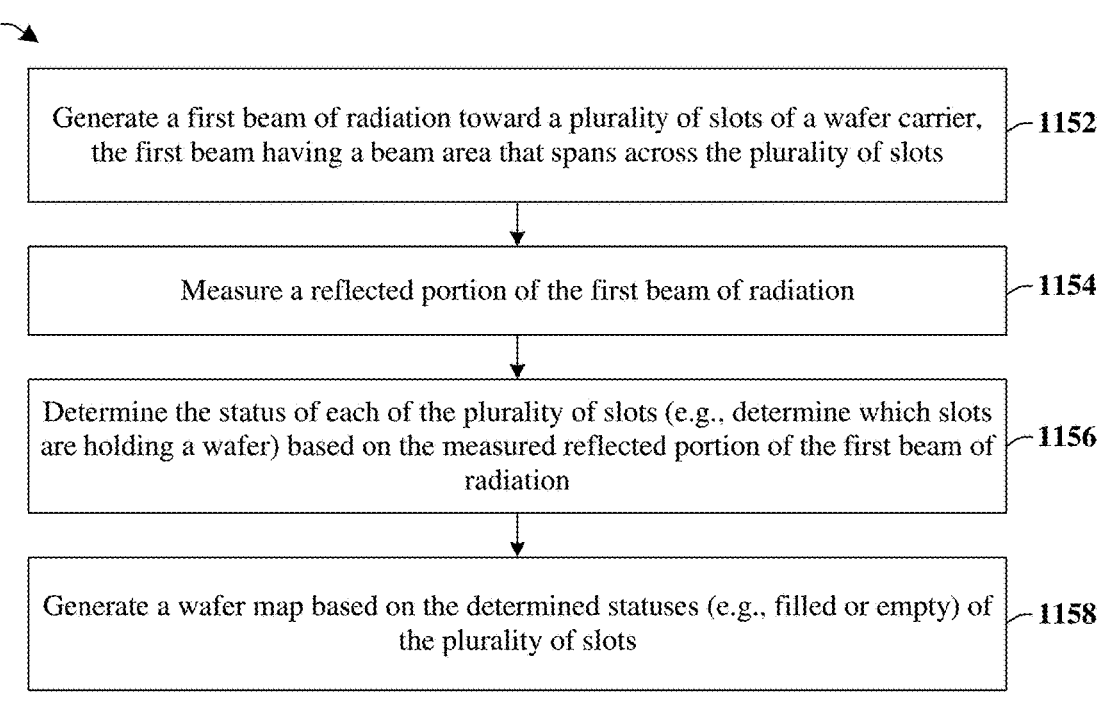

Generate a first beam of radiation toward a plurality of slots of a wafer carrier, the first beam having a beam area that spans across the plurality of slots ⟋1152

Measure a reflected portion of the first beam of radiation ⟋1154

Determine the status of each of the plurality of slots (e.g., determine which slots are holding a wafer) based on the measured reflected portion of the first beam of radiation ⟋1156

Generate a wafer map based on the determined statuses (e.g., filled or empty) of the plurality of slots ⟋1158

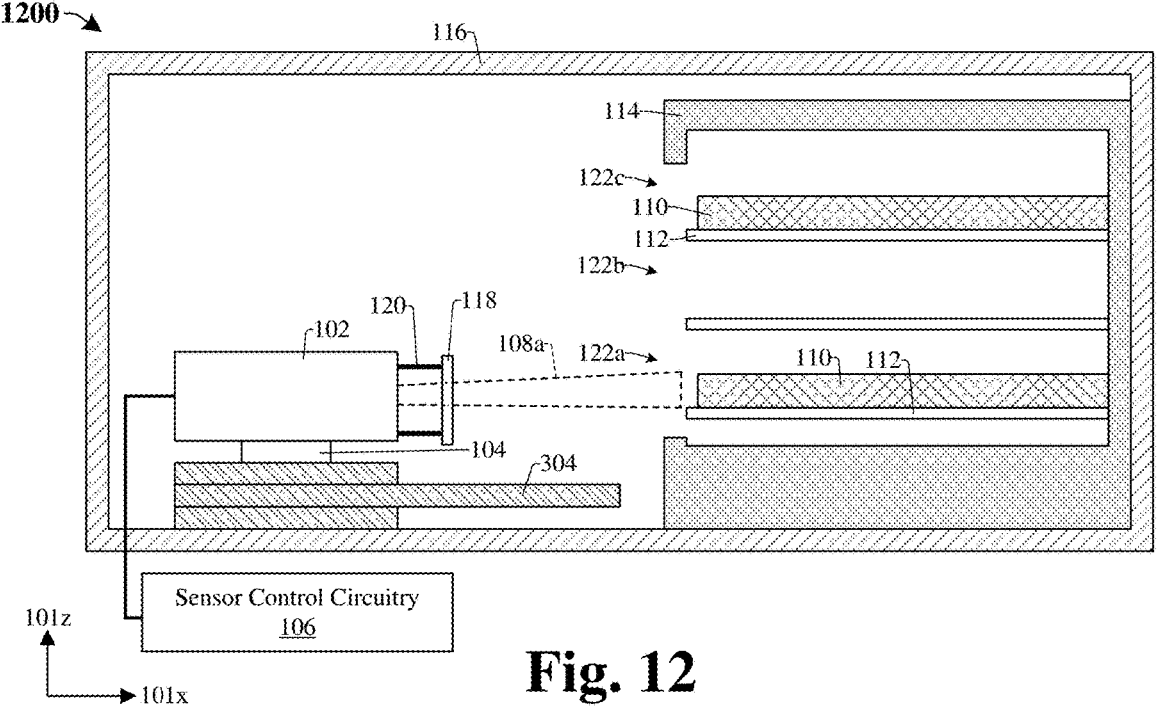

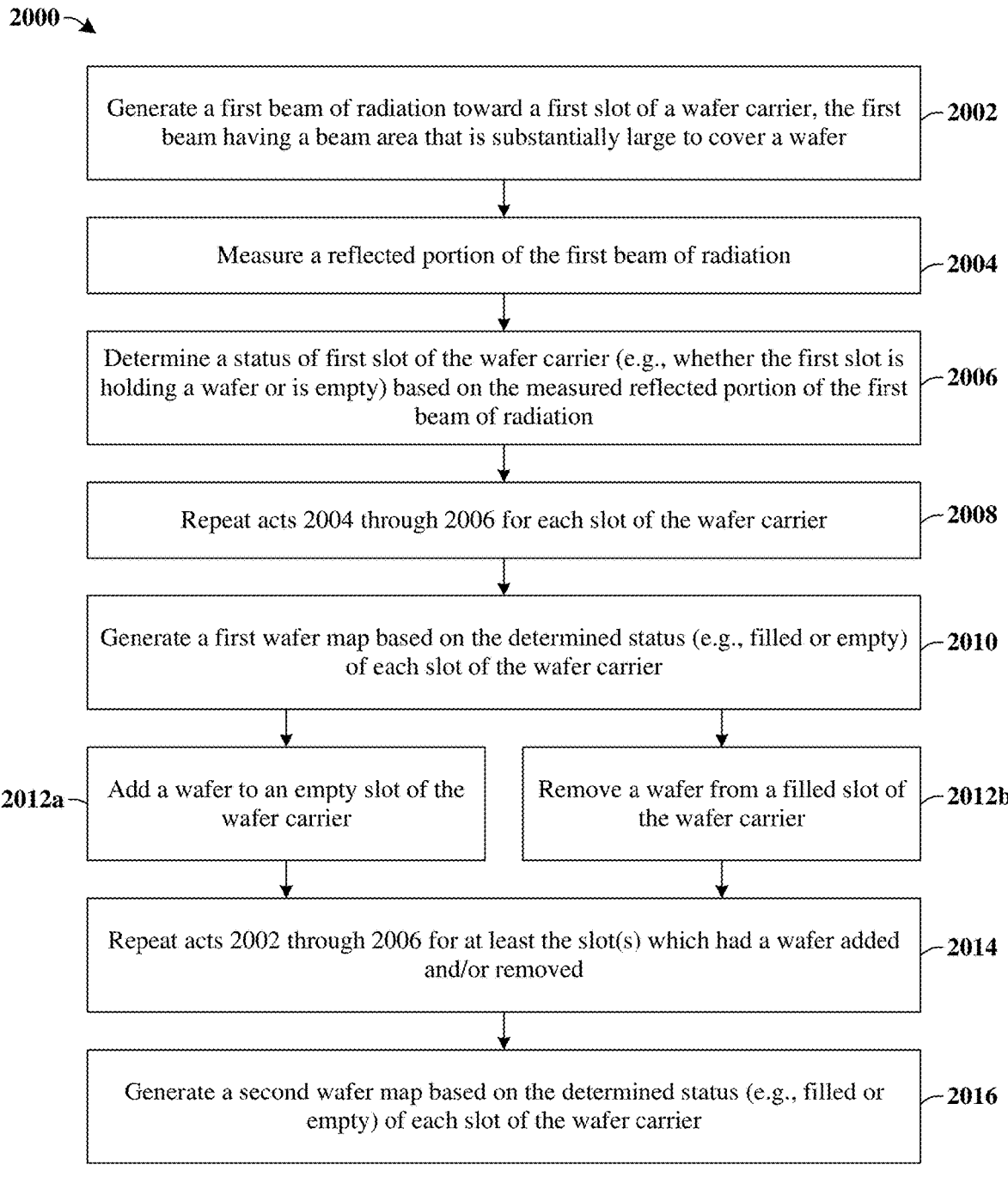

Generate a first beam of radiation toward a first slot of a wafer carrier, the first beam having a beam area that is substantially large to cover a wafer ⟋2002

Measure a reflected portion of the first beam of radiation ⟋2004

Determine a status of first slot of the wafer carrier (e.g., whether the first slot is holding a wafer or is empty) based on the measured reflected portion of the first beam of radiation ⟋2006

Repeat acts 2004 through 2006 for each slot of the wafer carrier ⟋2008

Generate a first wafer map based on the determined status (e.g., filled or empty) of each slot of the wafer carrier ⟋2010

2012a⟍ Add a wafer to an empty slot of the wafer carrier

Remove a wafer from a filled slot of the wafer carrier ⟋2012b

Repeat acts 2002 through 2006 for at least the slot(s) which had a wafer added and/or removed ⟋2014

Generate a second wafer map based on the determined status (e.g., filled or empty) of each slot of the wafer carrier ⟋2016

Fig. 20

METHOD FOR MAPPING WAFERS IN A WAFER CARRIER

REFERENCE TO RELATED APPLICATION

This Application is a Continuation of U.S. application Ser. No. 17/190,704, filed on Mar. 3, 2021, the contents of which are hereby incorporated by reference in their entirety.

BACKGROUND

Semiconductor device fabrication is a process used to create integrated circuits that are present in everyday electronic devices. A fabrication process is a multiple-step sequence comprising deposition, photolithographic, and chemical processing steps during which electronic circuits are gradually created on a wafer. During a fabrication process of a multi-dimensional integrated chip (e.g., a 3DIC), a wafer may be moved to different locations throughout fabrication machinery.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10 illustrates a cross-sectional view of some alternative embodiments of a method for mapping wafers in a FOUP.

FIG. 11A illustrates a flow diagram of some embodiments of a method for mapping wafers in a wafer carrier.

FIG. 11B illustrates a flow diagram of some alternative embodiments of a method for mapping wafers in a wafer carrier.

FIGS. 12-19 illustrate views of some embodiments of a method for mapping wafers in a FOUP, adjusting the wafers in the FOUP, and remapping the FOUP.

FIG. 20 illustrates a flow diagram of some embodiments of a method for mapping wafers in a wafer carrier, adjusting the wafers in the wafer carrier, and remapping the wafer carrier.

DETAILED DESCRIPTION

Figures 1, 2:
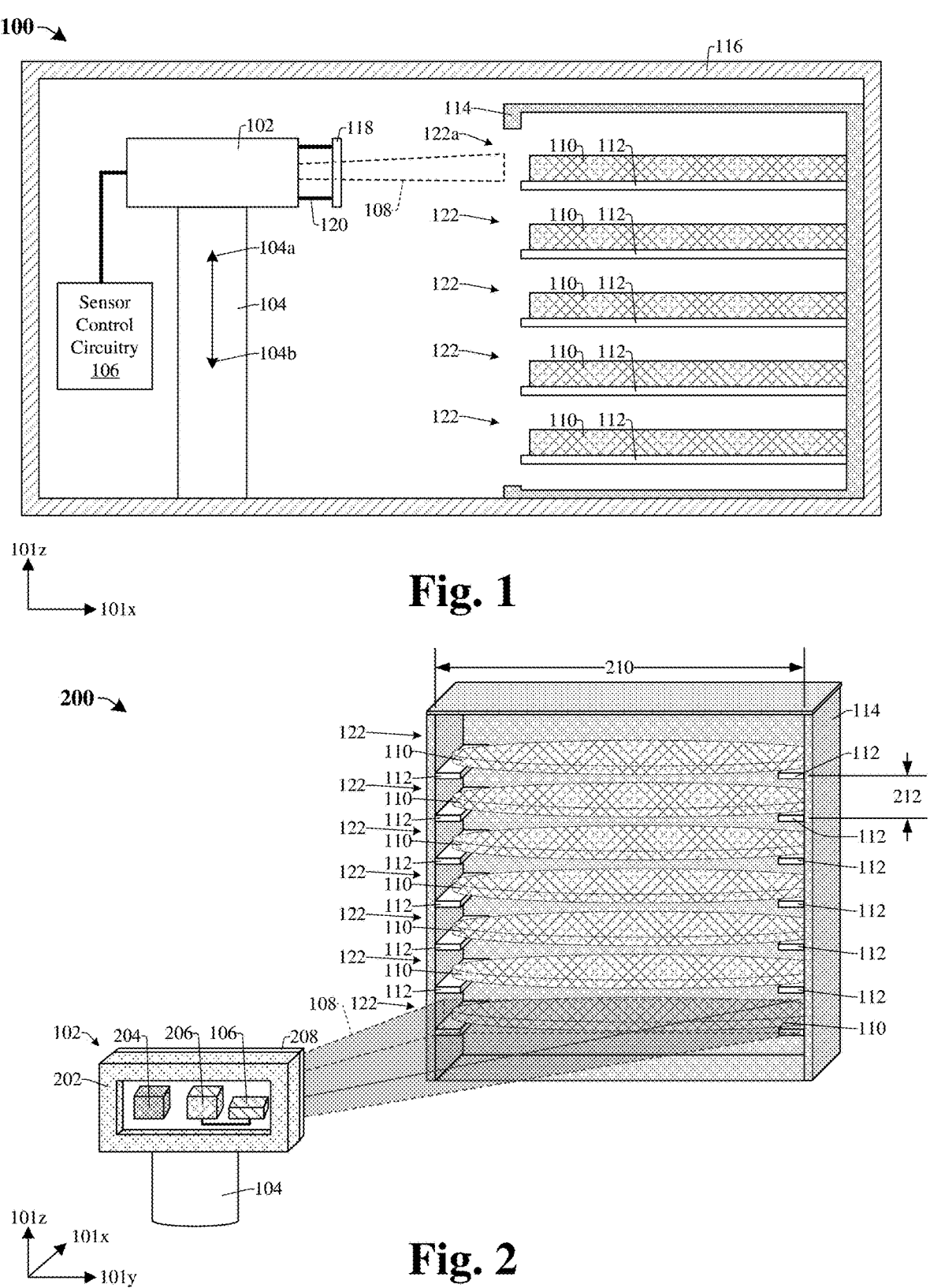
FIG. 1 illustrates a cross-sectional view of some embodiments of a process tool comprising an area image sensor for mapping wafers in a FOUP.
FIG. 2 illustrates a three-dimensional view of some embodiments of a process tool comprising an area image sensor for mapping wafers in a FOUP.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

During semiconductor fabrication, wafers are moved to different locations throughout fabrication machinery. For example, wafers may be moved (e.g., by robots) between processing chambers and front opening unified pods (FOUPs). Further, the FOUPs may for example, be used to store wafers and/or transport wafers between different fabrication machines. In some instances, a FOUP includes a plurality of slots that are each configured to securely and safely hold a wafer. When loading or unloading wafers from a FOUP, a robot may be told which slots already contain wafers and which slots do not (i.e., are empty). For example, when removing a wafer from a FOUP, a robot may be told in which slot the wafer is located so that the robot can select the correct wafer. Further, when loading a wafer into a FOUP, a robot may be told which slots are empty in order to avoid trying to load the wafer into an already occupied slot.

In some instances, if a robot is unaware of which slots contain wafers, the robot may attempt to load a wafer into an already occupied slot, which may cause the wafers to come into contact, which may result in damage to the wafers. Further, in some instances, if the robot is unaware of which slots contain wafers, the robot may attempt to remove a wafer from an empty slot, which in turn may waste time and/or resources.

In order to prevent these issues, some fabrication machinery may include wafer mapping sensors that are used to scan the slots of the FOUP to determine which slots are occupied and which are empty. These wafer mapping sensors may for example, project a point-beam of radiation toward the slots in the FOUP and measure an intensity of the radiation reflected back toward the sensor. However, these mapping sensors may have trouble sensing wafers that have low reflectivity (e.g., glass wafers or some other transparent wafers). For example, because the point-beam of radiation comprises a relatively small total amount of radiation, and because a glass wafer has low reflectivity, the total amount of radiation reflected by the glass wafer is small. Thus, when wafers in a FOUP have low reflectivity, these mapping sensors may have low accuracy when attempting to determine which slots in a FOUP contain the wafers.

Various embodiments of the present disclosure are related to a method for detecting wafers in a wafer carrier using an area image sensor to improve an accuracy of the wafer detection. The method comprises using the area image sensor to determine which slots of a wafer carrier contain wafers. For example, the area image sensor generates, with a radiation source, a first beam of radiation toward a first slot of the wafer carrier. The first beam of radiation has a beam area that is substantially large. In some embodiments, the beam area of the first beam of radiation is greater than or equal to a product of a width of the first slot multiplied by the distance between slots. The area image sensor measures, with a radiation sensor, a reflected portion of the first beam of radiation that reflected back toward the radiation sensor. Sensor control circuitry then determines if a wafer is in the first slot based on the measured reflected portion of first beam.

By using the area image sensor to detect wafers in the wafer carrier, an accuracy of the wafer detection may be improved. For example, because the area image sensor generates radiation having a large area, a relatively large total amount of radiation is generated toward the FOUP, and thus even if the reflectivity of the wafers in the FOUP is low, the total amount of radiation reflected will be high. For example, the radiation area and the sensing area are larger than or equal to a wafer, so as to cover a whole wafer.

FIG. 1 illustrates a cross-sectional view 100 of some embodiments of a process tool comprising an area image sensor 102 for mapping wafers 110 in a FOUP 114.

The area image sensor 102 and the FOUP 114 are arranged within a semiconductor fabrication machine housing 116. The FOUP 114 comprises a plurality of slots 122. In some embodiments, each of the slots 122 of the FOUP 114 comprise one or more shelves 112. The plurality of slots 122 are vertically stacked along a z-axis $101z$. Each slot of the plurality of slots 122 is configured to hold a wafer 110. In other words, the one or more shelves 112 of each slot 122 are configured to hold the wafer 110. The slots 122 have openings on one side of the FOUP 114 such that the wafers 110 may be moved into and/or out of the slots 122 along an x-axis $101x$.

In some embodiments, the area image sensor 102 is arranged on a first actuator 104. In such embodiments, the first actuator 104 is configured to move the area image sensor 102 in an upward direction $104a$ and in a downward direction $104b$ along the z-axis $101z$.

In some embodiments, a focusing device 118 is attached to the area image sensor 102 by way of one or more second actuators 120. In such embodiments, the one or more second actuators 120 are configured to move the focusing device 118 along the x-axis $101x$. In some other embodiments (not shown), the focusing device 118 is integrated within the area image sensor 102. In such other embodiments, the focusing device 118 may be moved along the x-axis $101x$ within the area image sensor 102 by one or more internal actuators (not shown).

The area image sensor 102 is configured to generate a beam of radiation 108 (e.g., electromagnetic radiation) toward the FOUP 114 and/or toward a wafer 110 in the FOUP 114. The beam of radiation 108 has a beam area (e.g., an area of the FOUP 114 and/or wafer 110 on which the beam of radiation 108 impinges) that is substantially large. For example, in some embodiments, the beam area is greater than or equal to a product of a width (e.g., 210 of FIG. 2) of a slot 122 of the FOUP 114 multiplied by the vertical distance (e.g., 212 of FIG. 2) between slots 122 of the FOUP 114. In other words, in some embodiments, the beam area spans one or more slots of the plurality of slots 122 (e.g., the beam area is greater than or approximately equal to the area of the opening of one slot). In some embodiments, the beam area measured at the area image sensor 102 is greater than the beam area measured at the FOUP 114 (e.g., the area of the beam increases as the distance from the area image sensor 102 increases).

In some embodiments, the focusing device 118 is configured to adjust the beam area of the radiation. For example, by moving the focusing device 118 along the x-axis $101x$ (e.g., via the one or more second actuators 120 or the one or more internal actuators (not shown)), the beam area may be increased or decreased.

The area image sensor 102 is also configured to measure an intensity of a reflected portion (not shown) of the beam of radiation 108 that is reflected off of the FOUP 114 and/or off of the wafer 110 in the FOUP 114 back toward the area image sensor 102.

Sensor control circuitry 106 is coupled to the area image sensor 102. In some embodiments, the sensor control circuitry 106 is arranged outside the area image sensor 102. In some other embodiments, the sensor control circuitry 106 is arranged within the area image sensor 102. The sensor control circuitry 106 is configured to determine which slots of the FOUP 114 are filled and which slots are empty. For example, the sensor control circuitry 106 is configured to determine if a wafer 110 is in a first slot $122a$ of the plurality of slots 122 based on a measured intensity of a reflected portion of the beam of radiation 108 that reflected off of the first slot $122a$ and/or a wafer 110 in the first slot $122a$ back toward the area image sensor 102.

In some embodiments, the sensor control circuitry 106 is further configured to determine the positions of any wafers 110 in the slots 122 of the FOUP 114. For example, if the sensor control circuitry 106 determines that a wafer 110 is in the first slot $122a$, the sensor control circuitry 106 is further configured to determine a position of the wafer 110 in the first slot $122a$ based off the reflected portion of radiation 108 that reflected off the wafer 110 in the first slot $122a$.

Because the area image sensor 102 generates radiation having a substantially large area, the total radiation generated toward the FOUP 114 will be high, and thus the total reflected radiation will be high even if the wafers 110 have low reflectivity. For example, even if the wafers 110 in the FOUP 114 have a reflectivity of just 1%, the total amount of reflected radiation will be high if the total amount of radiation generated toward the wafers 110 is very high. Thus, compared to some conventional sensors which only detect a point or a small part of the wafer 110, the area image sensor 102 may improve an accuracy of transparent wafer detection.

FIG. 2 illustrates a three-dimensional view 200 of some embodiments of a process tool comprising an area image sensor 102 for mapping wafers 110 in a FOUP 114.

In some embodiments, the area image sensor 102 comprises an area image sensor housing 202, a radiation source 204 arranged within the area image sensor housing 202, and a radiation sensor 206 arranged within the area image sensor housing 202. In some embodiments, the radiation sensor 206 is adjacent to the radiation source 204. In some embodiments, the area image sensor housing 202 is arranged on the first actuator 104. In some embodiments, the radiation source 204 is configured to generate (i.e., emit) a beam of radiation 108. In some embodiments (e.g., as illustrated in FIG. 2), a beam area of the beam of radiation 108 may have a height along the z-axis $101z$ and width along the y-axis $101y$. In some embodiments, the radiation sensor 206 is configured to measure a reflected portion of the beam of radiation 108 that impinges on the radiation sensor 206.

In some embodiments, the sensor control circuitry 106 is arranged within the area image sensor housing 202 and is coupled to the radiation sensor 206. In some other embodiments (see, for example, FIG. 1), the sensor control circuitry 106 is external to the area image sensor 102, is internal to the semiconductor fabrication machine housing (e.g., 116 of FIG. 1), and is coupled to the area image sensor 102. In still other embodiments (see, for example, FIGS. 7-9), the sensor control circuitry 106 is external to the area image sensor 102, is external to the semiconductor fabrication machine housing (e.g., 116 of FIGS. 7-9), and is coupled to the area image sensor 102. In some embodiments, the sensor control circuitry 106 may for example, have or exhibit some artificial intelligence or the like (e.g., the sensor control circuitry 106 may employ some machine learning mechanism or some other suitable intelligent mechanism).

In some embodiments, a transparent layer 208 is arranged on the area image sensor housing 202. For example, the transparent layer 208 may be or comprise a glass cover or the like. In such embodiments, the radiation source 204 emits the beam of radiation 108 through the transparent layer 208, and the radiation sensor 206 measures the reflected radiation that passes through the transparent layer 208 and impinges on the radiation sensor 206.

In some embodiments, the radiation source 204 may for example, be or comprise a light emitting diode, a light bulb, or some other suitable radiation source.

Figure 3:
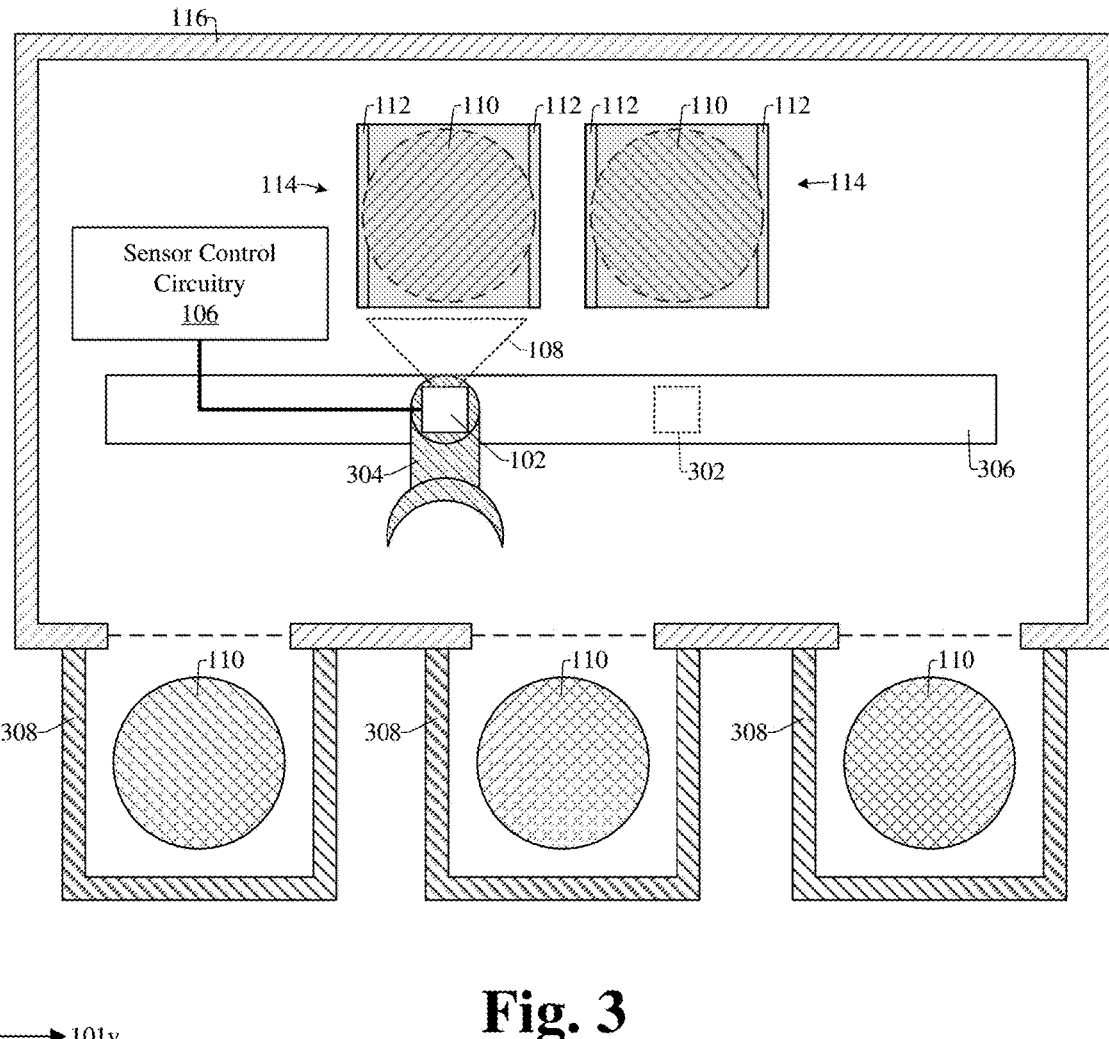
FIG. 3 illustrates a top view of some embodiments of a process tool comprising an area image sensor arranged on a transfer robot within a semiconductor fabrication machine housing.

FIG. 3 illustrates a top view 300 of some embodiments of a process tool comprising an area image sensor 102 arranged on a transfer robot 304 within a semiconductor fabrication machine housing 116.

In some embodiments, the transfer robot 304 is configured to move wafers 110 between one or more processing chambers 308 and the slots (e.g., 122 of FIG. 1) of the FOUPs 114. In some embodiments, the area image sensor 102 is arranged on and/or integrated with the transfer robot 304. In such embodiments, the transfer robot 304 may be configured to move the area image sensor 102 vertically along the z-axis 101z and/or horizontally along the y-axis 101y. In some embodiments, the first actuator (e.g., 104 of FIG. 2) and the area image sensor housing (e.g., 202 of FIG. 2) are arranged on the transfer robot 304.

In some other embodiments, the area image sensor may be separated from the transfer robot 304, as illustrated by item 302. In some embodiments, the first actuator (e.g., 104 of FIG. 2) and the area image sensor housing (e.g., 202 of FIG. 2) are separated from the transfer robot 304.

In some embodiments, the transfer robot 304 is arranged on a conveyer device 306 that is configured to move the transfer robot 304 and the area image sensor 102 along a y-axis 101y between the processing chambers 308 and the FOUPs 114. In some embodiments where the image sensor (e.g., 302) is separate from the transfer robot 304, the conveyer device 306 may also be configured to move the area image sensor (e.g., 302) along the y-axis 101y between the FOUPs. In some other embodiments where the image sensor (e.g., 302) is separate from the transfer robot 304, a separate conveyer device (not shown) adjacent to the conveyer device 306 may be configured to move the area image sensor (e.g., 304) along the y-axis 101y.

In some embodiments, the wafers 110 may alternatively be some other workpiece or the like. In some embodiments, the FOUP 114 may alternatively be or comprise a wafer cassette, some other wafer carrying apparatus, some other workpiece carrying apparatus, or some other workpiece holding apparatus. In some embodiments, the focusing device 118 may for example, be or comprise a focusing lens, some optical lens, some other lens, or some other suitable apparatus. In some embodiments, the radiation (e.g., 108) may be or comprise infrared radiation, visible light radiation, ultraviolet radiation, or some other suitable electromagnetic radiation. In some embodiments, the conveyer device 306 may for example, be or comprise a motorized track or some other suitable apparatus.

Figures 4, 5:
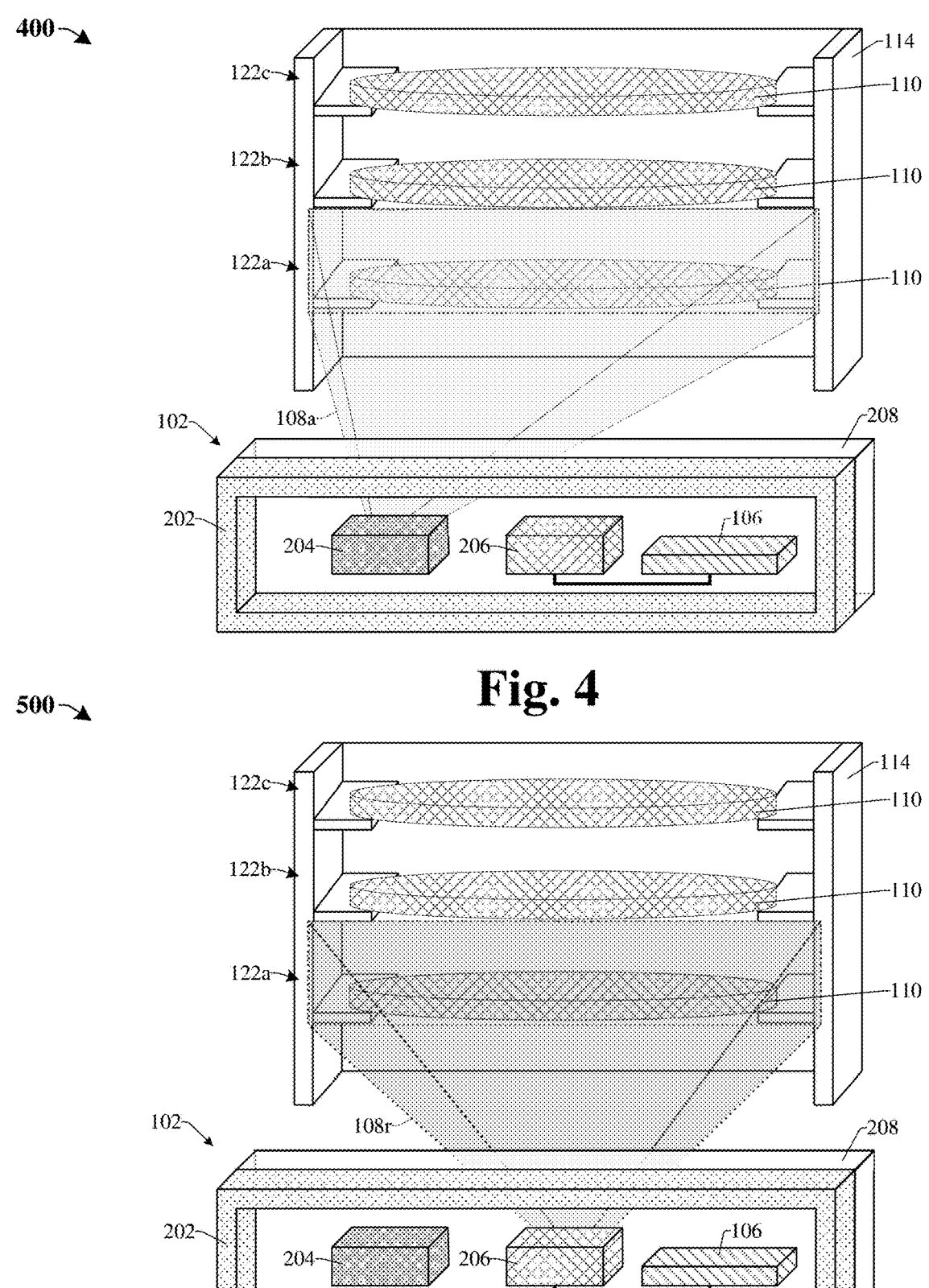
FIGS. 4 and 5 illustrate three-dimensional views of some embodiments of a method for scanning a first slot of a FOUP to determine if a wafer is in the first slot.

FIGS. 4 and 5 illustrate three-dimensional views 400 and 500 of some embodiments of a method for scanning a first slot 122a of a FOUP 114 to determine if a wafer 110 is in the first slot 122a. Although FIGS. 4 and 5 are described in relation to a method, it will be appreciated that the structures disclosed in FIGS. 4 and 5 are not limited to such a method, but instead may stand alone as structures independent of the method.

As shown in three-dimensional view 400 of FIG. 4, the radiation source 204 generates (i.e., emits) a first beam 108a of radiation toward a one or more slots (e.g., 122a, 122b, 122c) of the FOUP 114. For example, the radiation source 204 generates the first beam 108a of radiation toward a first slot 122a of the FOUP 114. In some embodiments, an area of the first beam 108a (e.g., an area of the FOUP 114 and/or wafer 110 on which the first beam 108a impinges) is substantially large. In some embodiments, an area of the first beam 108a is greater than or equal to the area of the opening of the first slot 122a. In some embodiments, the area of the opening of the first slot 122a is defined as the area that spans between inner sidewalls of the FOUP 114 and between shelves 112 of the FOUP 114. In other words, in some embodiments, the area of the opening of the first slot 122a is equal to the product of the width of the first slot 122a multiplied by the vertical distance between the first slot 122a and the second slot 122b.

As shown in three-dimensional view 500 of FIG. 5, the radiation sensor 206 measures a reflected portion 108r of the first beam (e.g., 108a of FIG. 4) of radiation that reflected is back toward, and impinges on, the radiation sensor 206. For example, since the first slot 122a is holding a wafer 110 in the embodiments illustrated in FIGS. 4 and 5, the radiation sensor 206 measures the reflected portion 108r of the first beam that reflected off of the wafer 110 in the first slot 122a. In some embodiments, the radiation sensor 206 also measures the reflected portion 108r of the first beam that reflected off of a portion of the FOUP 114 that defines the first slot 122a (e.g., the shelves (e.g., 112 of FIGS. 1 and 2) of the FOUP 114 and/or some other part of the FOUP 114).

In some other embodiments, when a wafer is not in the slot being scanned, for example, the radiation sensor 206 measures the reflected portion 108r of the first beam that reflected off of a portion of the FOUP 114 that defines the first slot 122a.

The sensor control circuitry 106 then determines if a slot is filled or not based on the measurement of reflected radiation taken by the radiation sensor 206. For example, the sensor control circuitry 106 determines if the first slot 122a is filled based on the measured reflected portion 108r of the first beam. Further, if the sensor control circuitry 106 determines that the first slot 122a is filled, the sensor control circuitry 106 may further determine the position of the wafer in the first slot 122a. Determining the position of the wafer in the first slot 122a may allow the sensor control circuitry to determine if the wafer is seated properly in the first slot 122a.

Figures 6, 7:
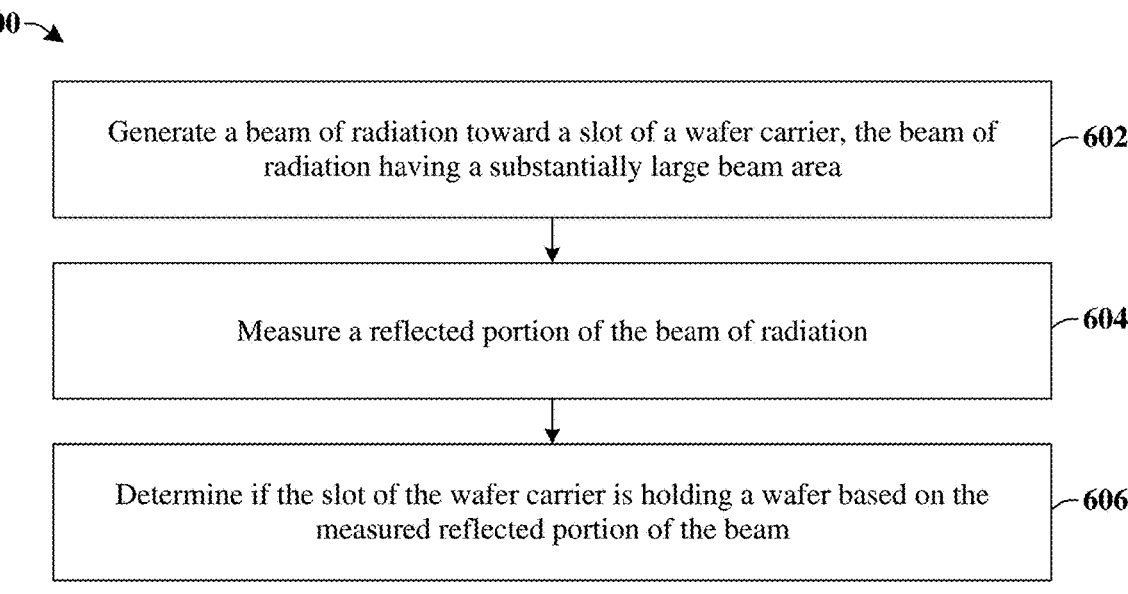
FIG. 6 illustrates a flow diagram of some embodiments of a method for determining if a wafer is in a slot of a wafer carrier.
FIGS. 7-9 illustrate cross-sectional views of some embodiments of a method for mapping wafers in a FOUP.

FIG. 6 illustrates a flow diagram of some embodiments of a method 600 for determining if a wafer is in a slot of a wafer carrier.

At 602, a beam of radiation is generated toward a slot of a wafer carrier, the beam of radiation having a substantially large beam area. FIG. 4 illustrates a three-dimensional view 400 of some embodiments corresponding to act 602.

At 604, a reflected portion of the beam of radiation is measured. FIG. 5 illustrates a three-dimensional view 500 of some embodiments corresponding to act 604.

At 606, whether the slot of the wafer carrier is holding a wafer is determined based on the measured reflected portion of the beam.

Figure 8:
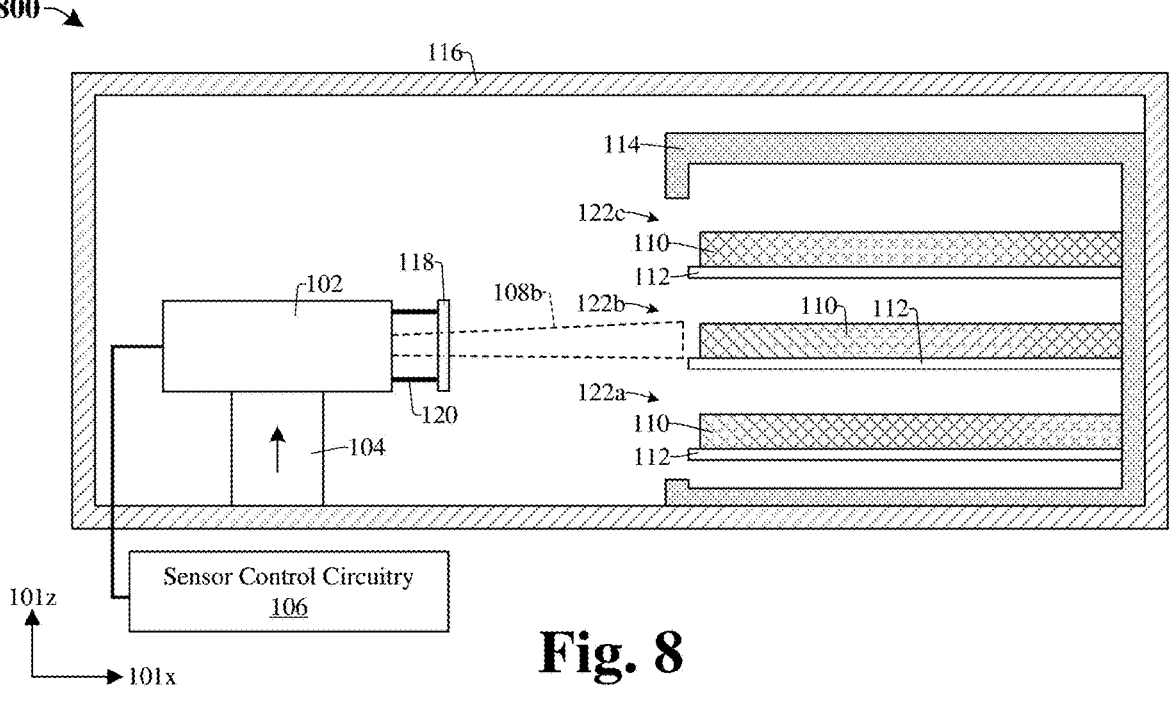
Figure 9:
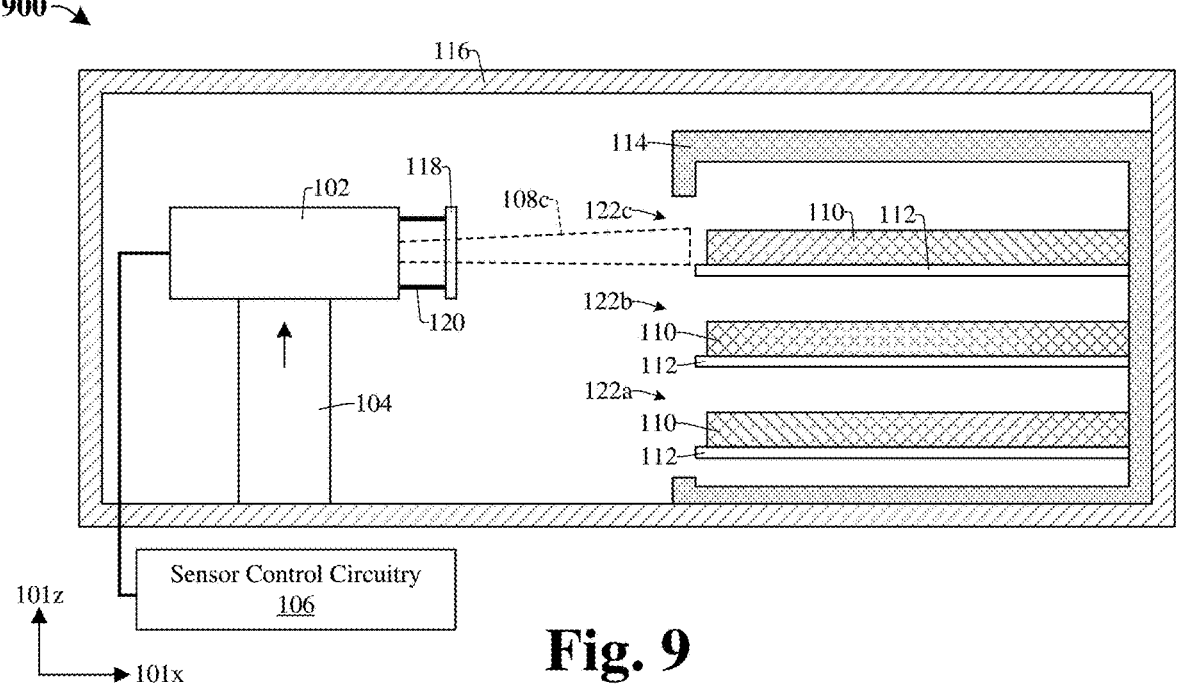

FIGS. 7-9 illustrate cross-sectional views 700-900 of some embodiments of a method for mapping wafers 110 in a FOUP 114. Although FIGS. 7-9 are described in relation to a method, it will be appreciated that the structures disclosed in FIGS. 7-9 are not limited to such a method, but instead may stand alone as structures independent of the method.

As shown in cross-sectional view 700 of FIG. 7, the area image sensor 102 is positioned at a first height and the area image sensor 102 scans a first slot 122a of the FOUP 114. The scan comprises generating (e.g., with a radiation source) a first beam of radiation 108a toward the first slot 122a (see, for example, FIG. 4). In some embodiments, the area of the first beam 108a is greater than or equal to the area of the opening of the first slot 122a. The scan also comprises measuring (e.g., with a radiation sensor) a reflected portion (not shown) of the first beam of radiation 108a that is reflected back toward, and impinges on, the radiation sensor (see, for example, FIG. 5). The sensor control circuitry 106 then determines if a wafer (e.g., a first wafer 110a) is in the first slot 122a based on the first measurement (e.g., the measured reflected portion of the first beam of radiation 108a). In some embodiments, if the sensor control circuitry 106 determines that a wafer (e.g., the first wafer 110a) is in the first slot 122a, the sensor control circuitry 106 may further determine the position of the wafer based on the first measurement.

In some embodiments, the focusing device 118 may be moved horizontally along the x-axis 101x to adjust the area of the first beam 108a prior to and/or during the generation of the first beam of radiation 108a.

As shown in cross-sectional view 800 of FIG. 8, the area image sensor 102 is moved (e.g., by the first actuator 104) vertically along the z-axis 101z to a second height and the area image sensor 102 scans a second slot 122b of the FOUP 114. The scan comprises generating a second beam of radiation 108b toward the second slot 122b. In some embodiments, the area of the second beam 108b is greater than or equal to the area of the opening of the second slot 122b. The scan also comprises measuring a reflected portion (not shown) of the second beam of radiation 108b that is reflected back toward, and impinges on, the radiation sensor. The sensor control circuitry 106 then determines if a wafer (e.g., a second wafer 110b) is in the second slot 122b based on the second measurement (e.g., the measured reflected portion of the second beam of radiation 108b). In some embodiments, if the sensor control circuitry 106 determines that a wafer (e.g., the second wafer 110b) is in the second slot 122b, the sensor control circuitry 106 may further determine the position of the wafer based on the second measurement.

In some embodiments, the focusing device 118 may be moved horizontally to adjust the area of the second beam 108b prior to and/or during the generation of the second beam of radiation 108b.

As shown in cross-sectional view 900 of FIG. 9, the area image sensor 102 is moved (e.g., by the first actuator 104) vertically along the z-axis 101z to a third height and the area image sensor 102 scans a third slot 122c of the FOUP 114. The scan comprises generating a third beam of radiation 108c toward the third slot 122c. In some embodiments, the area of the third beam 108c is greater than or equal to the area of the opening of the third slot 122c. The scan also comprises measuring a reflected portion (not shown) of the third beam of radiation 108c that is reflected back toward, and impinges on, the radiation sensor. The sensor control circuitry 106 then determines if a wafer (e.g., a third wafer 110c) is in the third slot 122c based on the third measurement (e.g., the measured reflected portion of the third beam of radiation 108c). In some embodiments, if the sensor control circuitry 106 determines that a wafer (e.g., the third wafer 110c) is in the third slot 122c, the sensor control circuitry 106 may further determine the position of the wafer based on the third measurement.

In some embodiments, the focusing device 118 may be moved horizontally to adjust the area of the third beam 108c prior to and/or during the generation of the third beam of radiation 108c.

In some embodiments, the sensor control circuitry 106 then generates a wafer map that lists which of the slots (e.g., 122a, 122b, 122c) are holding wafers 110 and which of the slots are empty. The wafer map is generated based on the determinations made regarding the state (e.g., filled or unfilled) of each of the slots. In some embodiments, the wafer map may also include information about the positions of each of the wafers 110 determined to be in the FOUP 114. For example, the wafer map may list which wafers 110 are seated properly in the FOUP 114 and/or which wafers 110 are seated improperly in the FOUP 114. In some embodiments, if it is determined that one or more wafers 110 are not seated properly in the FOUP 114, the one or more improperly seated wafers may be reseated by a transfer robot (e.g., 304 of FIG. 3).

Although FIGS. 7-9 illustrate scanning the slots from bottom to top, it will be appreciated that in some alternative embodiments, the slots may be scanned from top to bottom or in some other suitable order.

FIG. 10 illustrates a cross-sectional view 1000 of some alternative embodiments of a method for mapping wafers 110 in a FOUP 114. Although FIG. 10 is described in relation to a method, it will be appreciated that the structure disclosed in FIG. 10 is not limited to such a method, but instead may stand alone as a structure independent of the method.

As shown in cross-sectional view 1000 of FIG. 10, the area image sensor 102 scans a first slot 122a, a second slot 122b, and a third slot 122c of the FOUP 114 simultaneously. The scan comprises generating a first beam of radiation 108a toward the first slot 122a, the second slot 122b, and the third slot 122c. In some embodiments, the area of the first beam 108a spans across the first slot 122a, the second slot 122b, and the third slot 122c. In some embodiments, the area of the first beam 108a is greater than or equal to the combined area of the opening of the first slot 122a, the opening of the second slot 122b, and the opening of the third slot 122c. The scan also comprises measuring a reflected portion (not shown) of the first beam of radiation 108a that is reflected back toward, and impinges on, the radiation sensor (not shown) of the area image sensor 102. The sensor control circuitry 106 then determines which of the slots (e.g., 122*a*, 122*b*, 122*c*) are holding wafers based on the first measurement (e.g., the measured reflected portion of the first beam of radiation 108*a*).

In some embodiments, if the sensor control circuitry 106 determines that a wafer (e.g., a first wafer 110*a*, a second wafer 110*b*, and/or a third wafer) is in any of the first slot 122*a*, the second slot 122*b*, and/or the third slot 122*c*, the sensor control circuitry 106 may further determine the position(s) of the wafer(s) based on the first measurement.

In some embodiments, the sensor control circuitry then generates a wafer map based on the first measurement.

Although FIGS. 7-10 illustrate the FOUP 114 having three slots, each of which are holding a wafer, it will be appreciated that in some other embodiments, the FOUP 114 may have some other number of slots and any number of those slots may be filled or empty.

FIG. 11A illustrates a flow diagram of some embodiments of a method 1100 for mapping wafers in a wafer carrier.

At 1102, a first beam of radiation is generated toward a first slot of a wafer carrier, the first beam having a beam area that is substantially large. FIG. 7 illustrates a cross-sectional view 700 of some embodiments corresponding to act 1102.

At 1104, a reflected portion of the first beam of radiation is measured. FIG. 7 illustrates a cross-sectional view 700 of some embodiments corresponding to act 1104.

At 1106, a status of first slot of the wafer carrier (e.g., whether the first slot is holding a wafer or is empty) is determined based on the measured reflected portion of the first beam of radiation.

At 1108, acts 1104 through 1106 are repeated for each slot of the wafer carrier. FIGS. 8 and 9 illustrate cross-sectional views 800 and 900, respectively, of some embodiments corresponding to act 1108.

At 1110, a wafer map is generated based on the determined status (e.g., filled or empty) of each slot of the wafer carrier.

FIG. 11B illustrates a flow diagram of some alternative embodiments of a method 1150 for mapping wafers in a wafer carrier.

At 1152, a first beam of radiation is generated toward a plurality of slots of a wafer carrier, the first beam having a beam area that spans across the plurality of slots. FIG. 10 illustrates a cross-sectional view 1000 of some embodiments corresponding to act 1152.

At 1154, a reflected portion of the first beam of radiation is measured. FIG. 10 illustrates a cross-sectional view 1000 of some embodiments corresponding to act 1154.

At 1156, the status of each of the plurality of slots (e.g., determine which slots are holding a wafer) is determined based on the measured reflected portion of the first beam of radiation.

At 1158, a wafer map is generated based on the determined statuses (e.g., filled or empty) of the plurality of slots.

FIGS. 12-19 illustrate views 1200-1900 of some embodiments of a method for mapping wafers 110 in a FOUP 114, adjusting the wafers 110 in the FOUP 114, and remapping the FOUP 114. Although FIGS. 12-19 are described in relation to a method, it will be appreciated that the structures disclosed in FIGS. 12-19 are not limited to such a method, but instead may stand alone as structures independent of the method.

As shown in cross-sectional view 1200 of FIG. 12, the area image sensor 102 is positioned at a first height and the area image sensor 102 scans a first slot 122*a* of a FOUP 114. The scan comprises generating (e.g., with a radiation source) a first beam of radiation 108*a* toward the first slot 122*a* (see, for example, FIG. 4). In some embodiments, the area of the first beam 108*a* is greater than or equal to the area of the opening of the first slot 122*a*. The scan also comprises measuring (e.g., with a radiation sensor) a reflected portion (not shown) of the first beam of radiation 108*a* that is reflected back toward the area image sensor 102 (see, for example, FIG. 5). The sensor control circuitry 106 then determines if a wafer 110 is in the first slot 122*a* based on the first measurement (e.g., the measured reflected portion of the first beam of radiation 108*a*).

Figure 13:
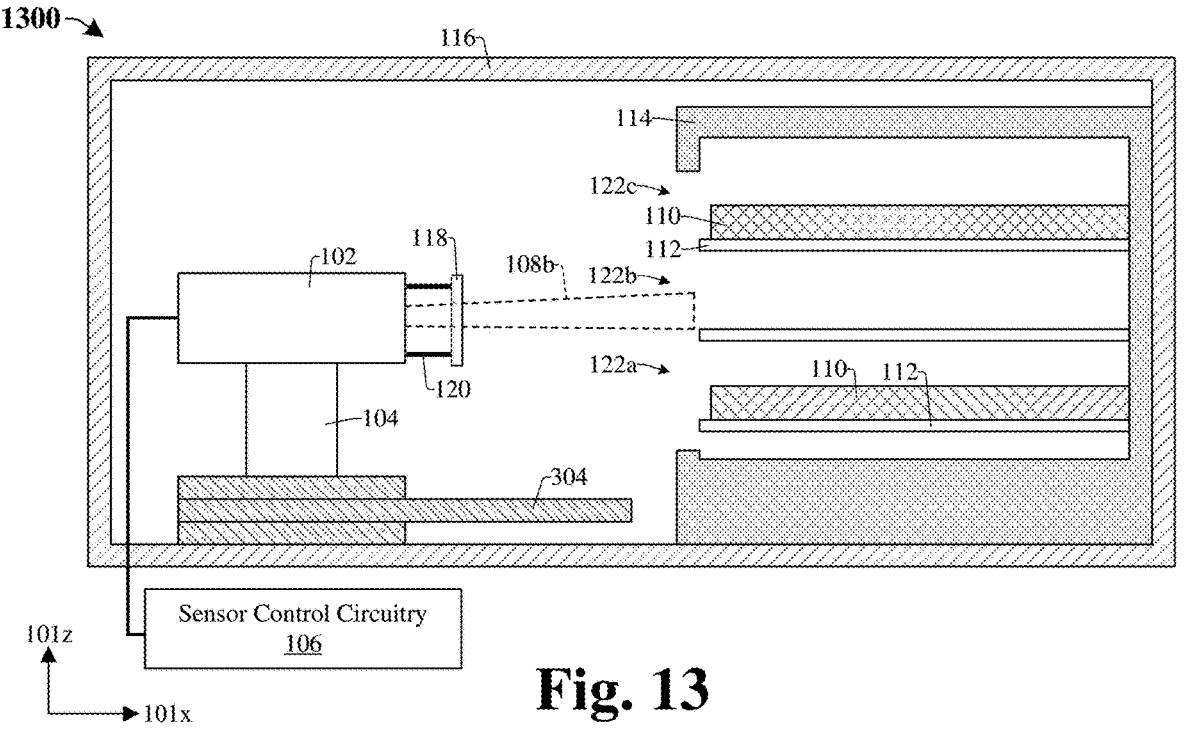

As shown in cross-sectional view 1300 of FIG. 13, the area image sensor 102 is moved vertically to a second height and the area image sensor 102 scans a second slot 122*b* of the FOUP 114. The scan comprises generating a second beam of radiation 108*b* toward the second slot 122*b*. In some embodiments, the area of the second beam 108*b* is greater than or equal to the area of the opening of the second slot 122*b*. The scan also comprises measuring a reflected portion (not shown) of the second beam of radiation 108*b* that is reflected back toward the area image sensor 102. The sensor control circuitry 106 then determines if a wafer 110 is in the second slot 122*b* based on the second measurement (e.g., the measured reflected portion of the second beam of radiation 108*b*).

Figure 14:
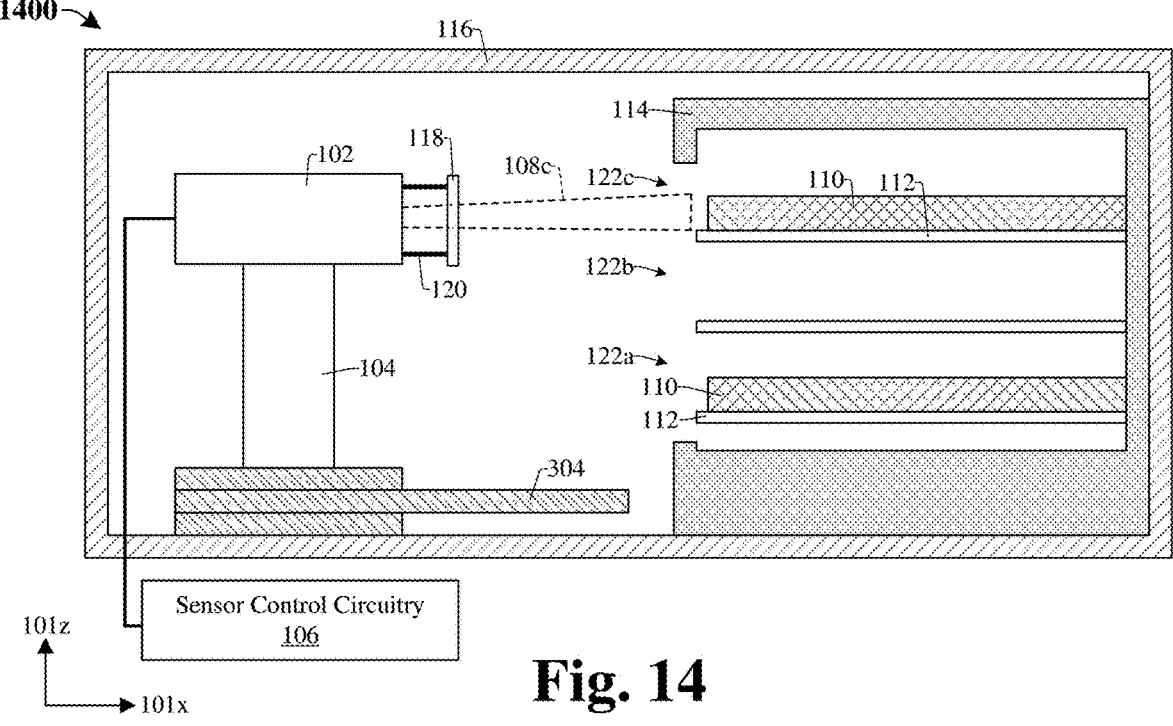

As shown in cross-sectional view 1400 of FIG. 14, the area image sensor 102 is moved vertically to a third height and the area image sensor 102 scans a third slot 122*c* of the FOUP 114. The scan comprises generating a third beam of radiation 108*c* toward the third slot 122*c*. In some embodiments, the area of the third beam 108*c* is greater than or equal to the area of the opening of the third slot 122*c*. The scan also comprises measuring a reflected portion (not shown) of the third beam of radiation 108*c* that is reflected back toward the area image sensor 102. The sensor control circuitry 106 then determines if a wafer 110 is in the third slot 122*c* based on the third measurement (e.g., the measured reflected portion of the third beam of radiation 108*c*).

In some embodiments, the sensor control circuitry then generates a first wafer map that lists which of the slots are holding wafers and which of the slots are empty. The first wafer map may also include the positions of the wafers in the slots. Although FIGS. 12-14 illustrate scanning each of the slots individually, it will be appreciated that in some alternative embodiments, each of the slots may be scanned simultaneously (e.g., as illustrated in FIG. 10).

Figure 15:
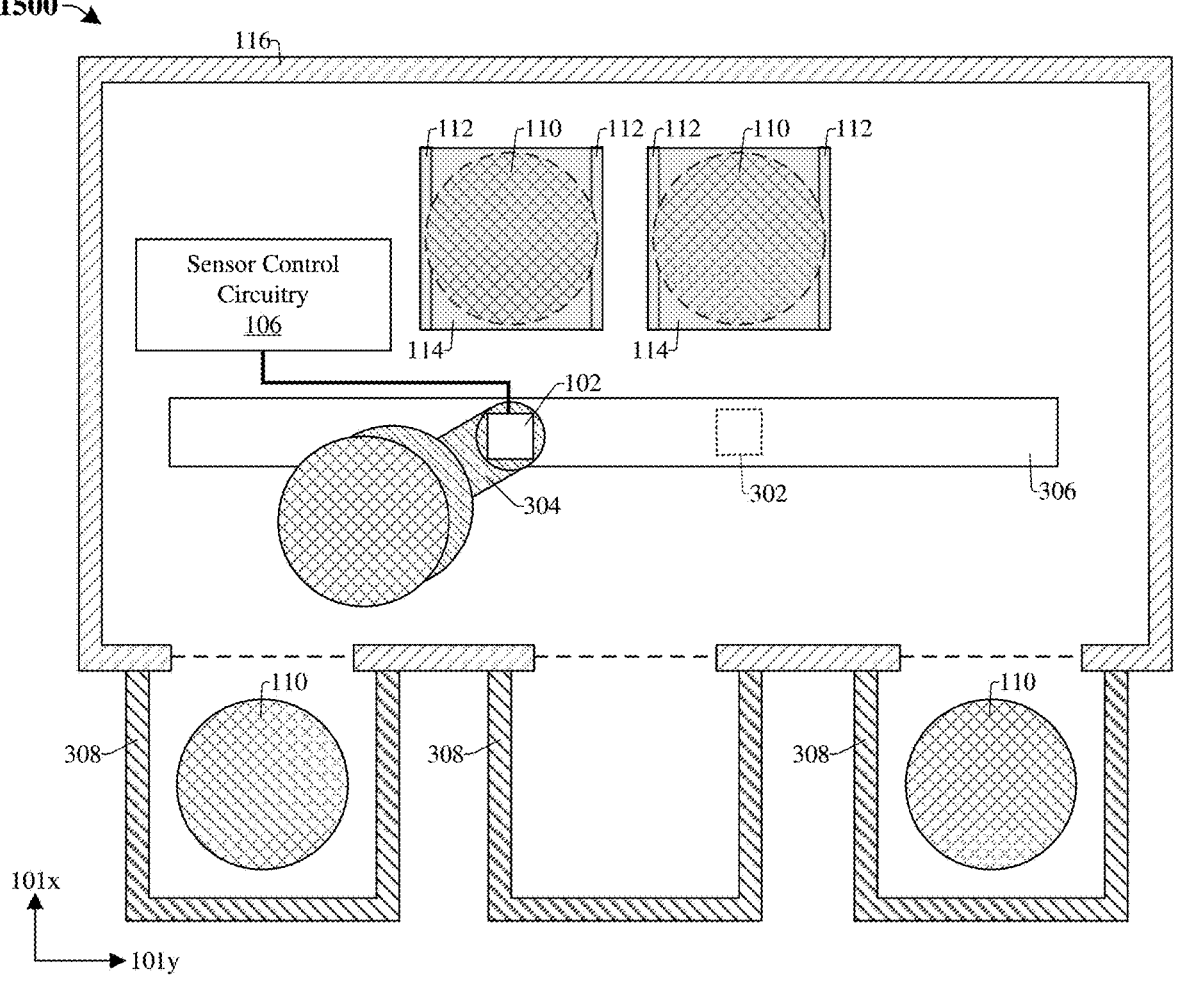
Figure 16:
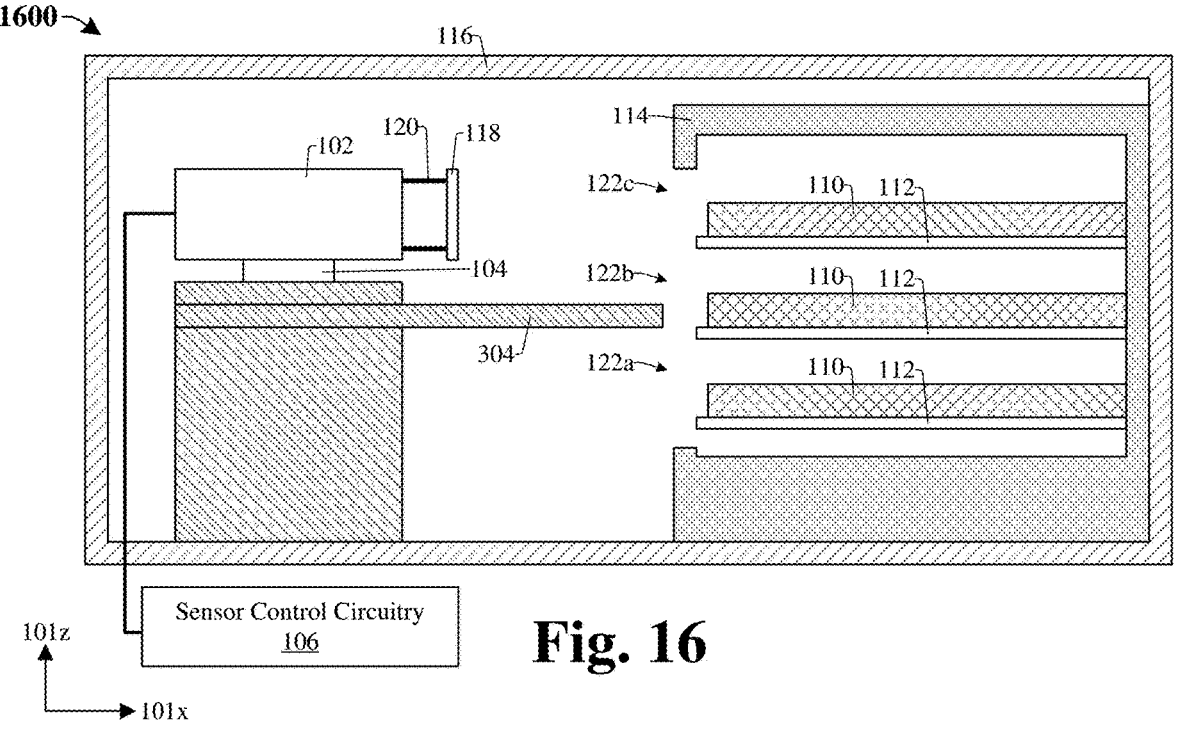

As shown in top view 1500 of FIG. 15 and cross-sectional view 1600 of FIG. 16, one or more wafers 110 are added to (i.e., placed in) one or more empty slots (e.g., the second slot 122*b*). For example, in some embodiments, a transfer robot 304 may move a wafer 110 from a processing chamber 308 to an empty slot in a FOUP 114. The transfer robot 304 may know which slots are empty based on the first wafer map.

In some other embodiments (not shown), one or more wafers 110 are removed (e.g., by the transfer robot 304) from one or more filled slots. In such embodiments, the one or more wafers 110 way then be moved by the transfer robot 304 to one or more processing chambers 308.

Figure 17:
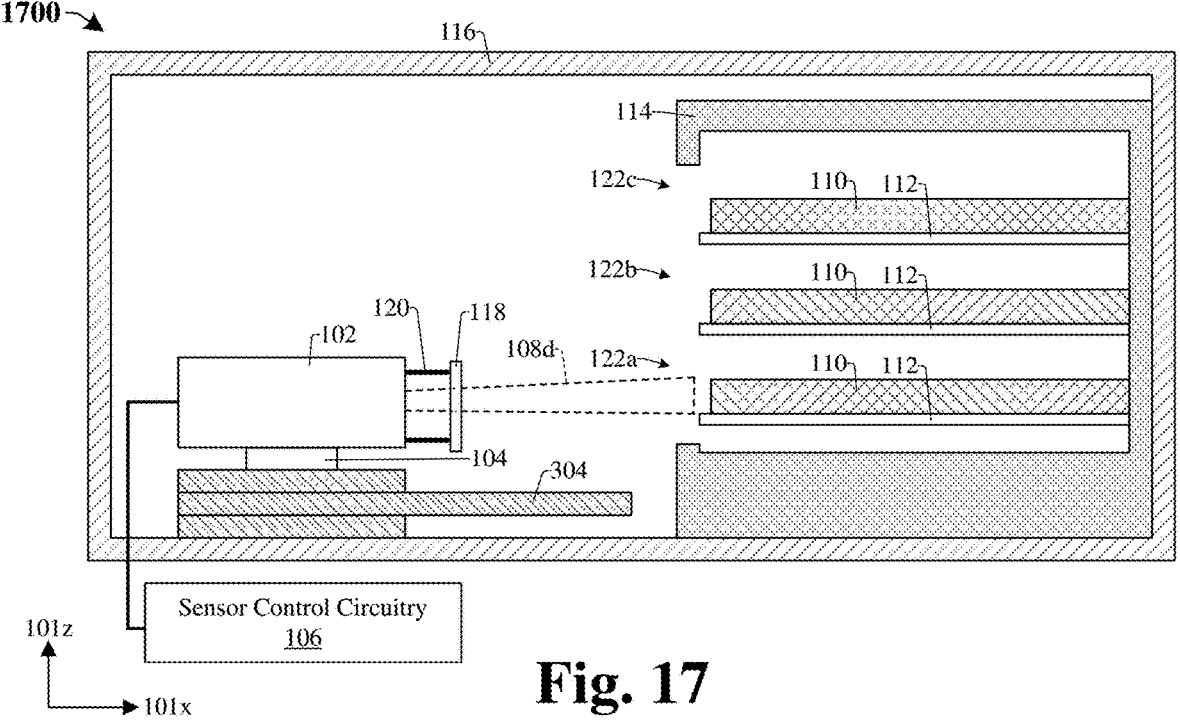

As shown in cross-sectional view 1700 of FIG. 17, the area image sensor is moved to the first height and the area image sensor 102 scans a first slot 122*a* of a FOUP 114. The scan comprises generating a fourth beam of radiation 108*d* toward the first slot 122*a*. In some embodiments, the area of the fourth beam 108*d* is greater than or equal to the area of the opening of the first slot 122*a*. The scan also comprises measuring a reflected portion (not shown) of the fourth beam of radiation 108*d* that is reflected back toward the area image sensor 102. The sensor control circuitry 106 then determines if a wafer 110 is in the first slot 122a based on the fourth measurement (e.g., the measured reflected portion of the fourth beam of radiation 108d).

Figure 18:
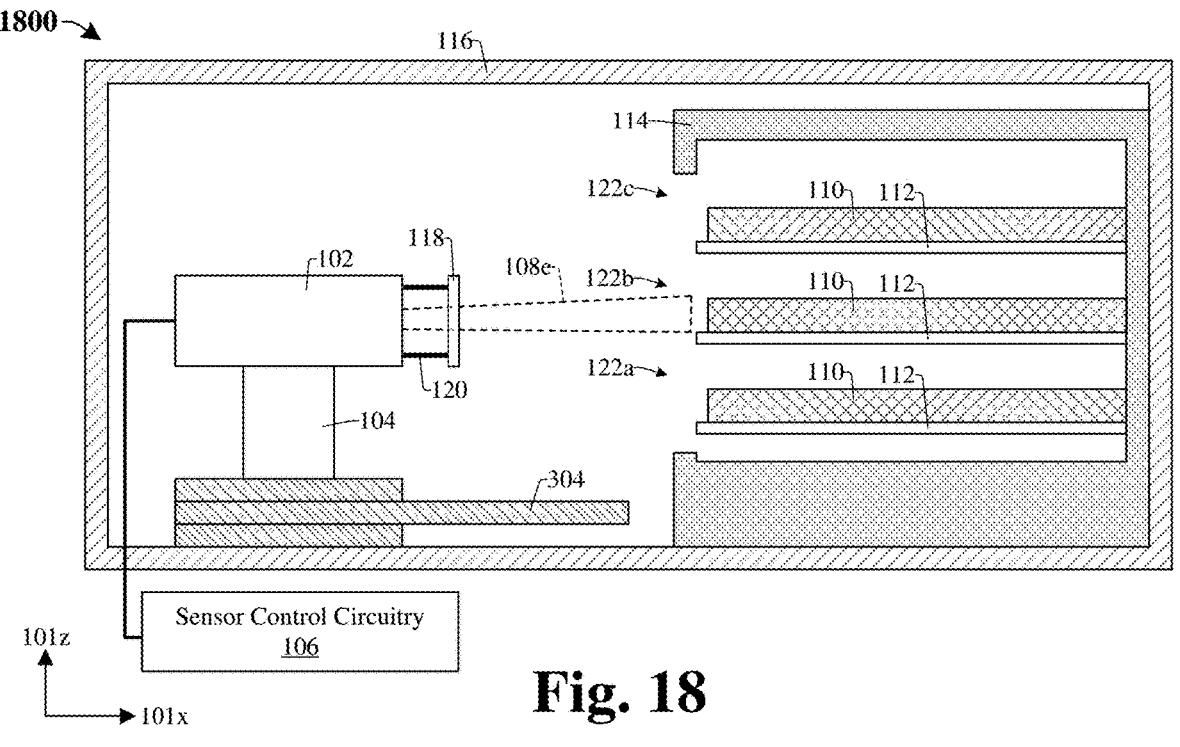

As shown in cross-sectional view 1800 of FIG. 18, the area image sensor 102 is moved to the second height and the area image sensor 102 scans a second slot 122b of the FOUP 114. The scan comprises generating a fifth beam of radiation 108e toward the second slot 122b. In some embodiments, the area of the fifth beam 108e is greater than or equal to the area of the opening of the second slot 122b. The scan also comprises measuring a reflected portion (not shown) of the fifth beam of radiation 108e that is reflected back toward the area image sensor 102. The sensor control circuitry 106 then determines if a wafer 110 is in the second slot 122b based on the fifth measurement (e.g., the measured reflected portion of the fifth beam of radiation 108e).

Figure 19:
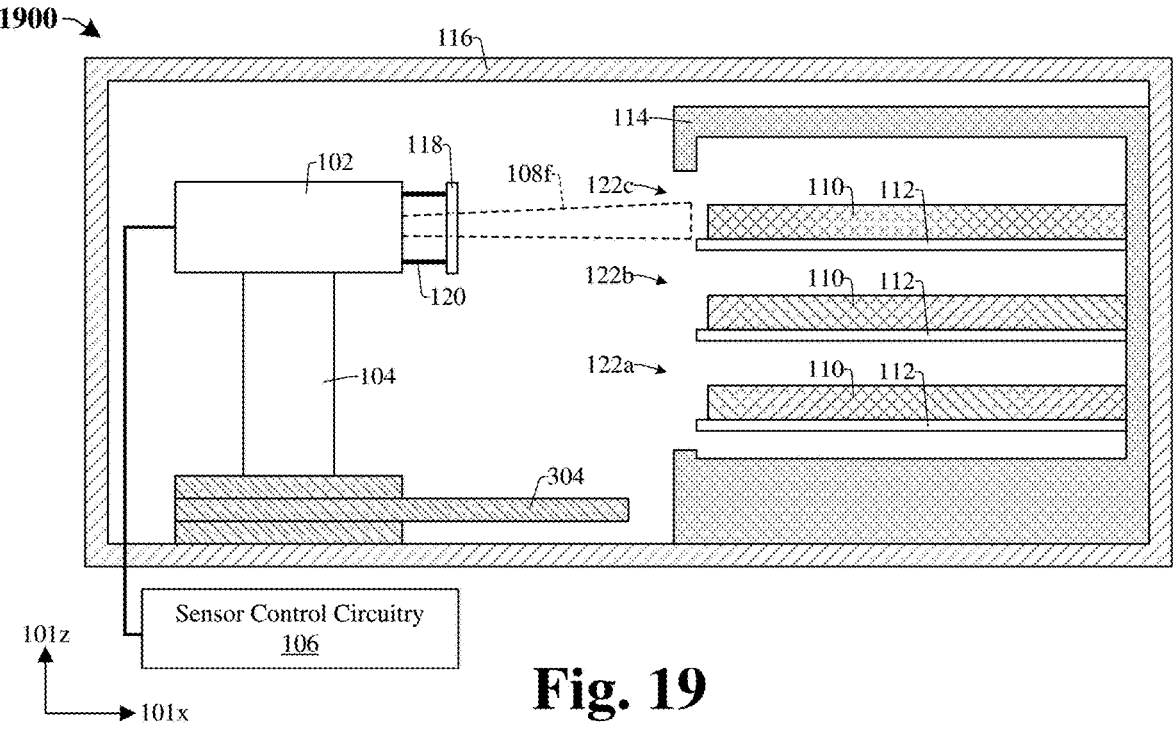

As shown in cross-sectional view 1900 of FIG. 19, the area image sensor 102 is moved to the third height and the area image sensor 102 scans a third slot 122c of the FOUP 114. The scan comprises generating a sixth beam of radiation 108f toward the third slot 122c. In some embodiments, the area of the sixth beam 108f is greater than or equal to area of the opening of the third slot 122c. The scan also comprises measuring a reflected portion (not shown) of the sixth beam of radiation 108f that is reflected back toward the area image sensor 102. The sensor control circuitry 106 then determines if a wafer 110 is in the third slot 122c based on the sixth measurement (e.g., the measured reflected portion of the sixth beam of radiation 108f).

In some embodiments, the sensor control circuitry 106 then generates a second wafer map that lists which of the slots are currently holding wafers and which of the slots are empty (e.g., to reflect the new status of the second slot 122b). In other words, in some embodiments, the sensor control circuitry 106 generates an updated wafer map that reflects the changes to the slots illustrated in FIGS. 15 and 16.

Although FIGS. 17-19 illustrate scanning each of the slots individually, it will be appreciated that in some alternative embodiments, each of the slots may be scanned simultaneously (e.g., as illustrated in FIG. 10).

Although FIGS. 17-19 illustrate scanning each of the slots in the same order as they were scanned in FIGS. 12-14, it will be appreciated that in some embodiments, the slots may be scanned in a different order than that illustrated in FIGS. 12-14.

Although FIGS. 17-19 illustrated rescanning each slot of the FOUP 114 after the one or more wafers have been added and/or removed, in some other embodiments, the method may alternatively comprise scanning only the one or more slots that were accessed (e.g., to either remove a wafer or add a wafer), and updating only the information pertaining to those one or more slots in the first map to form the second map in some embodiments. In some cases, by scanning only the accessed slots, time and/or some other resources may be saved by avoiding the scanning of slots that experienced no changes.

FIG. 20 illustrates a flow diagram of some embodiments of a method 2000 for mapping wafers in a wafer carrier, adjusting the wafers in the wafer carrier, and remapping the wafer carrier. While methods 600, 1100, 1150, and 2000 are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2002, a first beam of radiation is generated toward a first slot of a wafer carrier, the first beam having a beam area that is substantially large to cover a wafer. FIG. 12 illustrates a cross-sectional view 1200 of some embodiments corresponding to act 2002.

At 2004, a reflected portion of the first beam of radiation is measured. FIG. 12 illustrates a cross-sectional view 1200 of some embodiments corresponding to act 2004.

At 2006, a status of first slot of the wafer carrier (e.g., whether the first slot is holding a wafer or is empty) is determined based on the measured reflected portion of the first beam of radiation.

At 2008, acts 2004 through 2006 are repeated for each slot of the wafer carrier. FIGS. 13 and 14 illustrate cross-sectional views 1300 and 1400, respectively, of some embodiments corresponding to act 2008.

At 2010, a first wafer map is generated based on the determined status (e.g., filled or empty) of each slot of the wafer carrier.

In some embodiments, either act 2012a or act 2012b is be performed in the method 2000. In some other embodiments, both act 2012a and act 2012b are performed in the method 2000.

At 2012a, a wafer is added to an empty slot of the wafer carrier. FIGS. 15 and 16 illustrate views 1500 and 1600 of some embodiments corresponding to act 2012a.

At 2012b, a wafer is removed from a filled slot of the wafer carrier.

At 2014, acts 2002 through 2006 are repeated for at least the slot(s) which had a wafer added and/or removed. In some embodiments, acts 2002 through 2006 are repeated for each of the slots of the wafer carrier. FIGS. 17-19 illustrate cross-sectional views 1700-1900 of some embodiments corresponding to act 2014.

At 2016, a second wafer map is generated based on the determined status (e.g., filled or empty) of each slot of the wafer carrier.

Thus, the present disclosure relates to a method for detecting wafers in a wafer carrier using an area image sensor to improve an accuracy of the wafer detection.

Accordingly, in some embodiments, the present disclosure relates to a method. The method comprises generating a first beam of radiation toward a first slot of a workpiece carrier. The first beam of radiation has a first beam area that is greater than or equal to an area of an opening of the first slot. The method further comprises measuring a reflected portion of the first beam of radiation that is reflected toward, and impinges on, a radiation sensor. The method further comprises determining if the first slot of the workpiece carrier is holding a workpiece based on the measured reflected portion of the first beam of radiation.

In other embodiments, the present disclosure relates to a method. The method comprises generating, with a radiation source, a first beam of radiation toward a first slot of a workpiece carrier. The first beam of radiation has a first beam area that is greater than or equal to a product of a width of the first slot multiplied by a vertical distance between neighboring slots of the workpiece carrier. A radiation sensor measures a reflected portion of the first beam of radiation that is reflected toward, and impinges on, the radiation sensor. sensor control circuitry determines if the first slot of the workpiece carrier is holding a workpiece based on the measured reflected portion of the first beam of radiation. A first actuator moves the radiation source and the radiation sensor vertically along a vertical axis that extends from below the workpiece carrier to above the workpiece carrier. The radiation source generates a second beam of radiation toward a second slot of the workpiece carrier. The second beam of radiation has a second beam area that is greater than or equal to a product of a width of the second slot multiplied by the vertical distance between neighboring slots. The radiation sensor measures a reflected portion of the second beam of radiation that is reflected toward, and impinges on, the radiation sensor. The sensor control circuitry determines if the second slot of the workpiece carrier is holding a workpiece based on the measured reflected portion of the second beam of radiation. The sensor control circuitry generates a first workpiece carrier map that lists which slots of the workpiece carrier are holding workpieces.

In yet other embodiments, the present disclosure relates to a process tool. The process tool comprises a radiation source configured to generate electromagnetic radiation toward one or more slots of a workpiece carrier. A radiation sensor is adjacent to the radiation source and is configured to measure a reflected portion of the electromagnetic radiation that is reflected toward, and impinges on, the radiation sensor. A first actuator is configured to move the radiation source and the radiation sensor vertically along a vertical axis that extends from below the workpiece carrier to above the workpiece carrier. Sensor control circuitry is coupled to the radiation sensor and is configured to determine if the one or more slots of the workpiece carrier are holding one or more workpieces based on measurements taken by the radiation sensor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A process tool comprising:
a radiation source configured to generate a first beam of radiation toward a workpiece carrier having a first workpiece slot and a second workpiece slot;
a radiation sensor adjacent to the radiation source and configured to measure a reflected portion of the first beam that is reflected toward the radiation sensor;
sensor control circuitry coupled to the radiation sensor and configured to determine whether the first workpiece slot is holding a workpiece based on a measurement taken by the radiation sensor; and
a focusing device arranged between the radiation source and the workpiece carrier and configured to adjust the first beam from a first state in which the first beam covers the first workpiece slot to a second state in which the first beam covers both the first workpiece slot and the second workpiece slot.

2. The process tool of claim 1, wherein the radiation source, the radiation sensor, and the sensor control circuitry are arranged within an area image sensor housing.

3. The process tool of claim 2, further comprising:
a first actuator attached to the area image sensor housing, the focusing device attached to the first actuator, the first actuator configured to move the focusing device laterally toward and away from the radiation source to adjust the first beam between the first state and the second state.

4. The process tool of claim 3, further comprising:
a second actuator, the area image sensor housing arranged on the second actuator, the second actuator configured to move the area image sensor housing vertically.

5. The process tool of claim 1, wherein the first workpiece slot has a first shelf along a bottom of the first workpiece slot, the second workpiece slot has a second shelf along a bottom of the second workpiece slot and a top of the first workpiece slot, and a third shelf is along a top of the second workpiece slot,
wherein in the first state the first beam extends vertically from the first shelf to the second shelf, and wherein in the second state the first beam extends vertically from the first shelf to the third shelf.

6. The process tool of claim 5, wherein the first workpiece slot and the second workpiece slot are laterally between a first sidewall and a second sidewall of the workpiece carrier, wherein in the first state and the second state the first beam extends laterally from the first sidewall to the second sidewall.

7. The process tool of claim 1, further comprising:
a transfer robot configured to move workpieces between the first workpiece slot, the second workpiece slot, and one or more processing chambers.

8. The process tool of claim 7, wherein the radiation source, the radiation sensor, and the sensor control circuitry are arranged within an area image sensor housing, wherein the area image sensor housing is arranged on the transfer robot, and wherein the transfer robot is arranged on a conveyer device that is configured to move the transfer robot and the area image sensor housing laterally between the workpiece carrier and the one or more processing chambers.

9. The process tool of claim 7, wherein the radiation source, the radiation sensor, and the sensor control circuitry are arranged within an area image sensor housing, wherein the transfer robot is arranged on a conveyer device, wherein the area image sensor housing is arranged on a conveyer and spaced from the transfer robot, and wherein the conveyer device is configured to separately move both the transfer robot and the area image sensor housing laterally between the workpiece carrier and the one or more processing chambers.

10. A process tool comprising:
a radiation source configured to generate a first beam and a second beam of radiation toward a workpiece carrier having a first workpiece slot and a second workpiece slot;
a radiation sensor adjacent to the radiation source and configured to measure a reflected portion of the first beam and a reflected portion of the second beam that are reflected by the workpiece carrier;
sensor control circuitry coupled to the radiation sensor and configured to determine whether the first workpiece slot is holding a workpiece based on a measurement taken by the radiation sensor;
a focusing device arranged between the radiation source and the workpiece carrier; and
an actuator configured to move the focusing device so an area of the first beam encompasses an area of an opening of the first workpiece slot and an area of the second beam encompasses both the area of the opening of the first workpiece slot and the area of the opening of the second workpiece slot.

11. The process tool of claim 10, wherein the area of the second beam is greater than the area of the first beam.

12. The process tool of claim 10, wherein the actuator is configured to move the focusing device laterally towards the radiation source and away from the radiation source to adjust the first beam and the second beam.

13. The process tool of claim 12, wherein the actuator is between the focusing device and the radiation source, between the focusing device and the radiation sensor, and attached to the focusing device.

14. The process tool of claim 10, wherein the actuator is configured to move the focusing device while the radiation source is generating the first beam or the second beam.

15. The process tool of claim 10, wherein the actuator is configured to move the focusing device after the radiation source generates the first beam and before the radiation source generates the second beam.

16. A method comprising:
   generating a first beam and a second beam of radiation toward a workpiece carrier having a first workpiece slot and a second workpiece slot;
   measuring a reflected portion of the first beam and a reflected portion of the second beam that are reflected by the workpiece carrier; and
   determining whether the first workpiece slot is holding a workpiece based on the measured reflected portion of the first beam or the measured reflected portion of the second beam; and adjusting a beam area of the radiation so the first beam encompasses the first workpiece slot separately from the second workpiece slot and the second beam encompasses both the first workpiece slot and the second workpiece slot.

17. The method of claim 16, wherein the first beam and the second beam are generated by a radiation source,
   wherein the beam area of the radiation is adjusted while generating the first beam or the second beam by moving a focusing device toward the radiation source and away from the radiation source.

18. The method of claim 16, wherein the first beam and the second beam are generated by a radiation source,
   wherein the beam area of the radiation is adjusted after generating the first beam and before generating the second beam by moving a focusing device toward the radiation source and away from the radiation source.

19. The method of claim 16, wherein an area of the second beam impinging on the workpiece carrier is greater than an area of the first beam impinging on the workpiece carrier.

20. The method of claim 16, wherein in response to determining that the first workpiece slot is holding a workpiece, the method further comprises:
   determining a position of the workpiece in the first workpiece slot based on the measured reflected portion of the first beam or the measured reflected portion of the second beam to determine whether the workpiece is seated properly in the first workpiece slot.

* * * * *